(12) United States Patent
Mulkens et al.

(10) Patent No.: US 6,473,163 B2
(45) Date of Patent: Oct. 29, 2002

(54) FLUORESCENCE RADIATION FILTER

(75) Inventors: Johannes C Mulkens, Maastricht; Paul Van der Veen, Eindhoven, both of (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/726,480

(22) Filed: Dec. 1, 2000

(65) Prior Publication Data

US 2001/0050762 A1 Dec. 13, 2001

(30) Foreign Application Priority Data

Dec. 1, 1999 (EP) .............................................. 99204052

(51) Int. Cl.⁷ .......................... G03B 27/54; G03B 27/42
(52) U.S. Cl. ........................................... 355/67; 355/53
(58) Field of Search ............................... 355/52, 53, 55, 355/67–71; 250/548, 226; 359/350, 587–589

(56) References Cited

U.S. PATENT DOCUMENTS

| | | | | |
|---|---|---|---|---|
| 5,072,108 A | * | 12/1991 | Auilera et al. ............... | 250/226 |
| 5,164,858 A | * | 11/1992 | Aguilera et al. ............. | 359/587 |
| 6,072,899 A | * | 6/2000 | Irie et al. ..................... | 382/149 |
| 6,249,372 B1 | * | 6/2001 | Kobayashi et al. ......... | 359/326 |
| 6,342,312 B2 | * | 1/2002 | Oba et al. .................... | 428/696 |

* cited by examiner

Primary Examiner—Russell Adams
Assistant Examiner—Hung Henry Nguyen
(74) Attorney, Agent, or Firm—Pillsbury Winthrop LLP

(57) ABSTRACT

The filter has alternating layers of relatively high and relatively low refractive index media. The layers are formed as a coating on an optical component in the projection lens system of a lithographic projection apparatus. The filter transmits radiation at a wavelength of 157 nm for exposing an image of a mask pattern on a resist-coated substrate while attenuating radiation resulting from fluorescence in optical components of the lithographic projection apparatus, caused by the imaging radiation, and which if not attenuated would reduce the contrast of the image exposed in the resist.

17 Claims, 4 Drawing Sheets

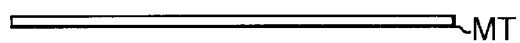
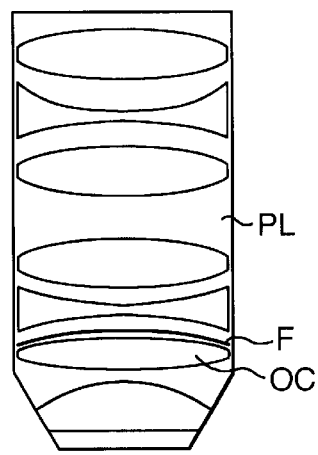
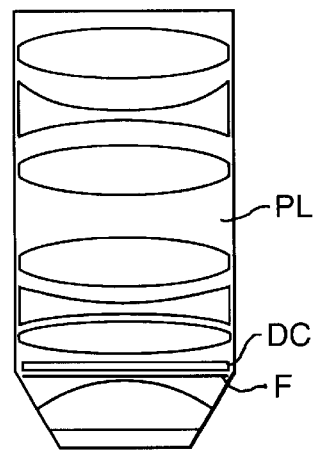
Fig.2.  Fig.3.
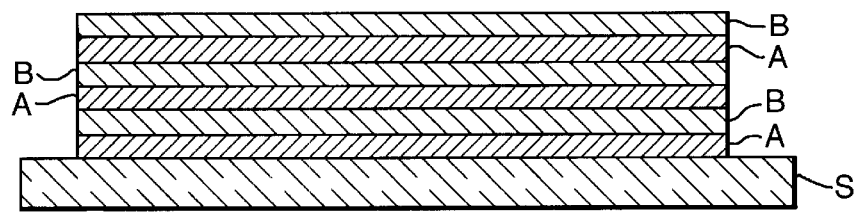
Fig.4.

FLUORESCENCE RADIATION FILTER

BACKGROUND OF THE INVENTION

1. Field of the Invention

The present invention relates to a filter, such as may be used to attenuate unwanted radiation and transmit desired radiation. More particularly, the invention relates to the use of the filter in a lithographic projection apparatus comprising:

- a radiation system for supplying a projection beam of radiation;
- a first object table for holding a mask;
- a second object table for holding a substrate; and
- a projection system for imaging an irradiated portion of the mask onto a target portion of the substrate.

2. Background of the Related Art

For the sake of simplicity, the projection system may hereinafter be referred to as the "lens"; however, this term should be broadly interpreted as encompassing various types of projection system, including refractive optics, reflective optics, and catadioptric systems, for example. The radiation system generally comprises an illumination system which may also include elements operating according to any of these designs for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatus are described, for example, in International Patent Applications WO 98/28665 and WO 98/40791, incorporated herein by reference.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (comprising one or more dies) on a substrate (silicon wafer) which has been coated with a layer of photosensitive material (resist). In general, a single wafer will contain a whole network of adjacent target portions which are successively irradiated via the reticle, one at a time. In one type of lithographic projection apparatus, each target portion is irradiated by exposing the entire reticle pattern onto the target portion at once, such an apparatus is commonly referred to as a wafer stepper. In an alternative apparatus—which is commonly referred to as a step-and-scan apparatus—each target portion is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed V at which the wafer table is scanned will be a factor M times that at which the reticle table is scanned. More information with regard to lithographic devices as here described can be gleaned from International Patent Application WO 97/33205, incorporated herein by reference.

Problems with the prior art include that, in the semiconductor manufacturing industry, there is increasing demand for imaging ever smaller features at increasing densities. This is necessitating the use of shorter wavelength radiation, for example ultraviolet light with a wavelength of 157 nm or 126 nm. However, there is a problem that, as the wavelength decreases, the radiation becomes more energetic and there is an increasing tendency for optical components (including the mask) in the lithographic apparatus to show some fluorescence effects. The particular fluorescence light observed depends on the color center or centers in the material of the optical components. In the case of fused silica and $CaF_2$, the emission of fluorescence light with marked colors can be observed, such as red, green, yellow and blue visible light. Similarly the materials used for the constituent layers of multi-layer coatings, e.g. a multi-layer anti reflex coating, or the materials used for single layer coatings, e.g. single-layer anti reflex coatings, on the optical components or on the mask may exhibit fluorescence effects. Also any contaminant present in the path of the projection beam of radiation may exhibit fluorescence effects. The fluorescence light can be actinic, i.e. the resist can be sensitive to this light, particularly when it is at the short wavelength or blue end of the spectrum, e.g. when its wavelength spectrum is between 350 nm and 550 nm. Thus the fluorescence light can cause unwanted exposure of the resist, which can cause a general degradation of the contrast of the image pattern since the fluorescence light is generally emitted in all directions and so constitutes a background dose to the resist. This can be detrimental to the quality of the exposure and can affect the process parameters.

$MgF_2$ and BaF can also be used for the lens material in the lithography apparatus, but these materials can also have some fluorescence effect.

An object of the present invention is to avoid or alleviate the above problems.

SUMMARY OF THE INVENTION

According to the present invention there is provided a lithographic projection apparatus for imaging of a mask pattern in a mask onto a substrate which is at least partially covered by a layer of energy sensitive material (resist), the apparatus comprising:

- a radiation system for supplying a projection beam of electromagnetic radiation with a wavelength less than 160 nm;
- a first object table for holding a mask;
- a second object table for holding a substrate;
- a projection system for imaging irradiated portions of the mask onto target portions of the substrate;
- characterised by further comprising:
- a filter, located in the projection beam path, for attenuating fluorescence radiation with a wavelength longer than that of the projection beam.

An apparatus according to the invention, comprising a filter, can enable the radiation (such as 157 nm or 126 nm light) for defining the projected image to be transmitted, whilst the filter attenuates unwanted fluorescence light by reflecting and/or absorbing it.

The filter preferably comprises a plurality of layers, each layer having a refractive index, wherein the refractive index alternates between a relatively high value and a relatively low value or vice versa between successive layers.

The materials of different refractive index and the number of layers can be selected to define the transmission and attenuation characteristics of the filter.

The filter can comprise either a coating formed on a dedicated carrier substrate, preferably with substantially planar parallel surfaces, or a coating formed on another optical component. The latter possibility makes it very compact and straightforward to incorporate the filter in a given optical system.

The filter can also comprise two or more carriers placed in series in the projection beam, each carrier provided with a coating transmitting the desired radiation and attenuating a particular constituent part of the wavelength spectrum of the unwanted fluorescence radiation. This approach allows relaxed design specifications for each constituent filter in the series. A single filter or a series of filters, as described above, may hereinafter be referred to as the "filter".

According to a further aspect of the invention there is provided a method of manufacturing a device using a lithographic projection apparatus comprising:

a radiation system for supplying a projection beam of electromagnetic radiation with a wavelength less than 160 nm;

a first object table for holding a mask;

a second object table for holding a substrate; and a projection system for imaging irradiated portions of the mask onto target portions of the substrate; the method comprising the steps of:

providing a mask bearing a pattern to said first object table;

providing a substrate provided with a radiation-sensitive layer to said second object table;

irradiating portions of the mask and imaging said irradiated portions of the mask onto said target portions of said substrate; characterised by the step of:

employing a filter, located in the projection beam path, to attenuate fluorescence radiation with a wavelength longer than that of the projection beam.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its attendant advantages will be further elucidated with the aid of exemplary Embodiments and the accompanying schematic drawings, in which like reference numerals and letters indicate identical or like parts, and in which:

FIG. 2 schematically depicts the location of a filter on an optical component incorporated in the projection lens of the projection apparatus of FIG. 1;

FIG. 3 schematically depicts a location of a filter on a dedicated carrier substrate with substantially planar parallel surfaces;

FIG. 4 schematically depicts a dichroic coating on a substrate, the coating comprising six layers of alternating high and low refractive index;

DETAILED DESCRIPTION OF THE INVENTION

Figure 1:
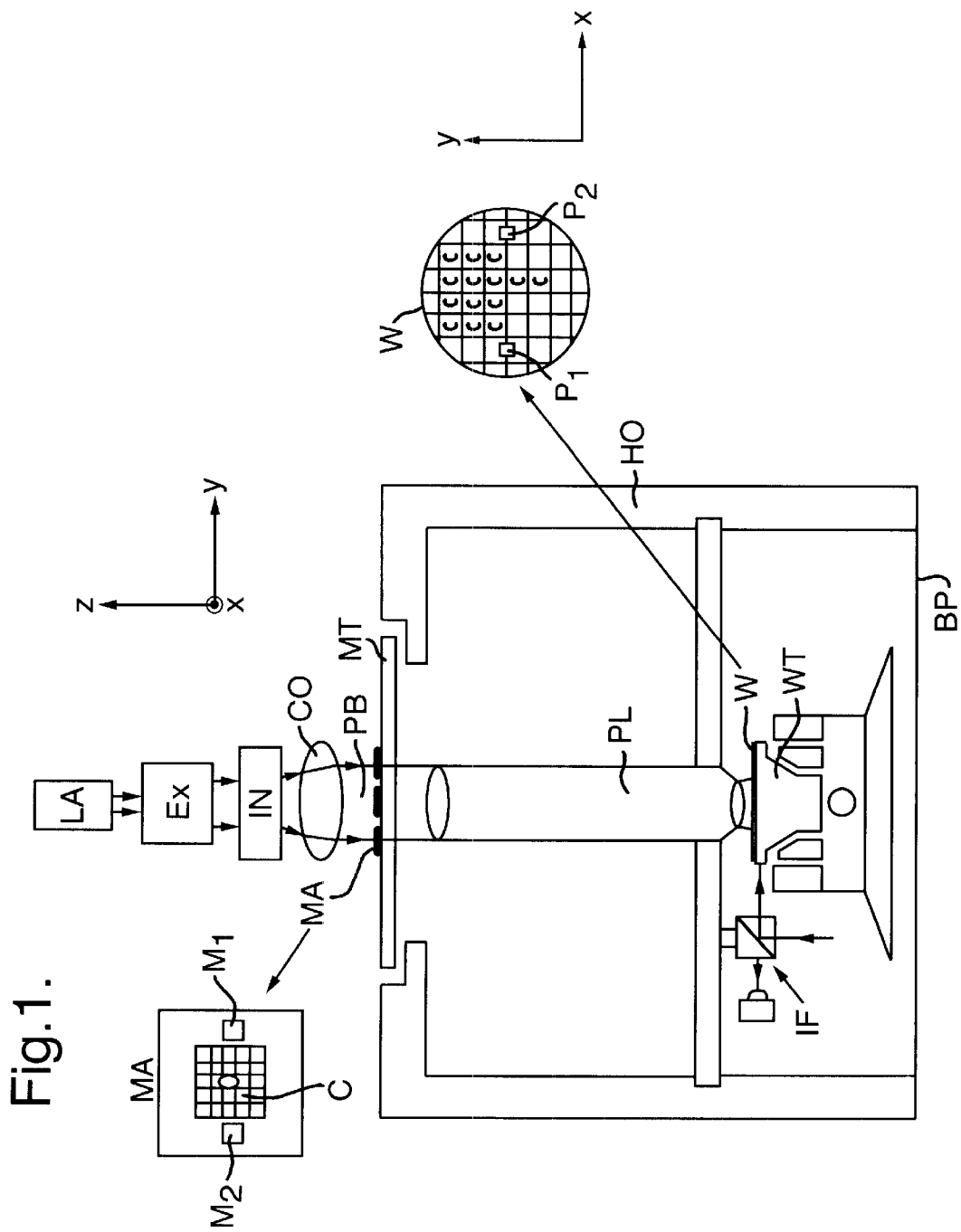
FIG. 1 schematically depicts a lithographic projection apparatus according to the invention.

The apparatus of FIG. 1 comprises:

a radiation system LA, Ex, IN, CO for supplying a projection beam PB of radiation (e.g. UV radiation with a wavelength smaller than 160 nm);

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive or catadioptric system, or a mirror group) for imaging an irradiated portion of the mask MA onto a target portion C (die) of the substrate W.

As here depicted, the apparatus is of a transmissive type (i.e. has a transmissive mask).

However, in general, it may also be of a reflective type, for example.

The radiation system comprises a source LA (e.g. a Hg lamp, or excimer laser) which produces a beam of radiation. This beam is passed along various optical components comprised in the illumination system,—e.g. beam shaping optics Ex, an integrator IN and a condenser CO—so that the resultant beam PB has a desired uniformity and intensity distribution in its cross-section.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the interferometric displacement and measuring means IF, the substrate table WT can be moved accurately, e.g., so as to position different target areas C in the path of the beam PB. Similarly, the first positioning means can be used to accurately position the mask MA with respect to the path of the beam PB, e.g., after mechanical retrieval of the mask MA from a mask library, or during a scan. The reference signs $M_1$, $M_2$ correspond to reticle alignment marks and the references $P_1$, $P_2$ correspond to wafer alignment marks. These marks are used to respectively align the wafer and the reticle respective to each other. In general, movement of the object tables MT, WT will be realized with the aid of a long stroke module (coarse positioning) and a short stroke module (fine positioning), which are not explicitly depicted in FIG. 1.

In the case of a wafer stepper, as opposed to a step-and-scan device, the mask table MT may only be connected to the short stroke positioning means, or may just be fixed. The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=-¼or-⅕). In this manner, a relatively large target portion C can be exposed, without having to compromise on resolution.

FIG. 2 shows in more detail the lens PL, the mask table MT, and the substrate table WT. It is presently preferred that the filter F in FIG. 2 embodying the invention comprises a dichroic coating on one of the optical components OC of the projection lens PL, between the first object table (mask table) MT and the second object table (substrate table) WT, i.e. in use the filter is located in the beam path between the reticle and the wafer resist. The projection beam in this example consists of ultraviolet radiation with a wavelength of 157 nm which is transmitted by the filter (coating) whereas any unwanted fluorescence light from preceding optical components is reflected and/or absorbed by the filter.

FIG. 3 shows in more detail the situation where the filter F comprises a coating formed on a dedicated carrier substrate DC. To minimize component costs and to relax positioning tolerances for the carrier substrate, said substrate shall preferably be planar parallel.

The preferred form of the dichroic coating is one or more pairs of layers of different refractive index media A and B. Each pair of layers is also known as a bi-layer. In the complete structure, the layers of different refractive index A and B alternate. For example, with six layers (three bi-layers) the configuration is A, B, A, B, A, B. In FIG. 4 such a six-layer stack formed on a substrate S is schematically depicted. The layers of one type (A or B) have a relatively high refractive index and the layers of the other type (B or A) have a relatively low refractive index, the refractive indices being relatively high or low with respect to each other. For example, each layer A can consist of a material with a relatively high refractive index and each layer B can consist of a material with a relatively low refractive index, or vice versa. In the presently preferred embodiments all layers of type A consist of the same first material and all layers of type B consist of the same second material, but this need not necessarily be the case.

Figure 5:
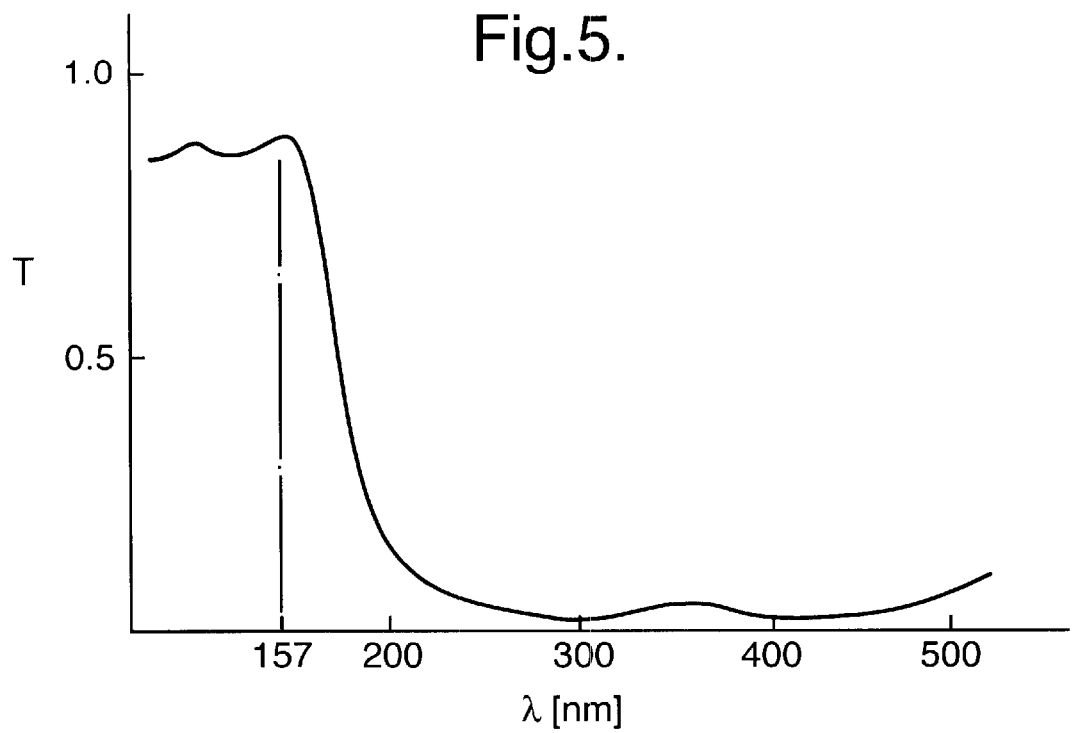
FIG. 5 schematically depicts the spectral transmission properties of a cut-off filter suitable for use in the situations depicted in FIG. 2 and FIG. 3.

One embodiment of a filter for a lithography apparatus according to the invention is a cut-off filter. The filter of this embodiment is not or only partly transmissive to radiation at wavelengths longer than a particular value, such as 200 nm, but does allow radiation at shorter wavelengths to substantially pass, such as the desired 157 nm radiation; see FIG. 5 in which T, along the vertical axis, is the transmittance and $\lambda$, along the horizontal axis, is the wavelength of the fluorescence radiation. A filter of this type will typically comprise a relatively small number of layers, such as eight.

Figure 6:
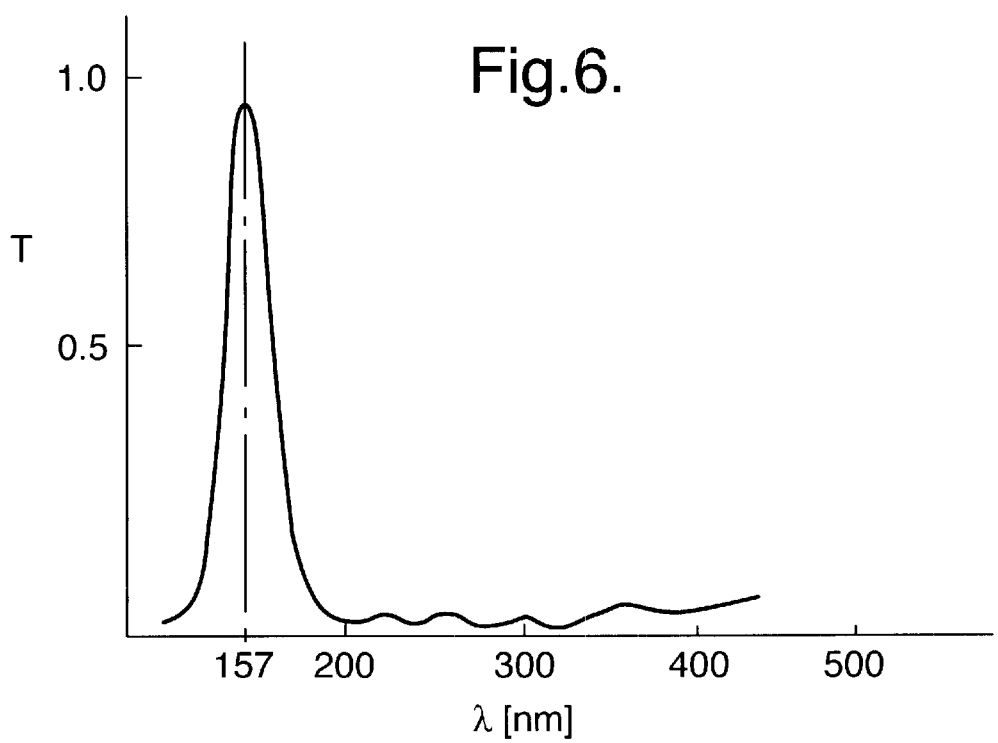
FIG. 6 schematically depicts the spectral transmission properties of a band-pass filter suitable for use in the situations depicted in FIG. 2 and FIG. 3.

Another embodiment of a filter for a lithography apparatus according to the invention is a band-pass filter. This type of filter is transmissive to only a band of wavelengths, which can comprise a relatively small range of wavelengths, and the transmission can be located at or around a particular desired wavelength, such as 157 nm in the presently preferred embodiment; see FIG. 6 in which T, along the vertical axis, is the transmittance and $\lambda$, along the horizontal axis, is the wavelength of the fluorescence radiation. A filter of the band-pass type will typically comprise approximately 40 layers.

In embodiments of the present invention, the layers preferably each have a thickness equal to about a quarter of the wavelength of the radiation that the filter is designed to transmit (the wavelength being that of the radiation in the medium of each respective layer).

Suitable materials for forming the layers of the filter include oxides and fluorides. In particular, the material for the relatively low refractive index layers can be selected from: $SiO_2$, $MgF_2$, $AlF_3$, $NaF$, $Na_3AlF_6$, $Na_5Al_3F_{14}$, for example. The material for the relatively high refractive index layers can be selected from among: $Al_2O_3$, $LaF_3$, $NdF_3$, $GdF_3$, $DyF_3$, $LnF_3$, $ThF_4$ and $CeF_3$, for example. These materials are suitable for forming a filter which is transmissive at a wavelength of 157 nm. The exemplary filter is a dichroic coating, in other words it functions by interference between radiation reflected at the interfaces between the different layers. By choosing the thicknesses and number of layers, the transmission and attenuation characteristics of the filter as a function of wavelength can be tuned.

Figure 7:
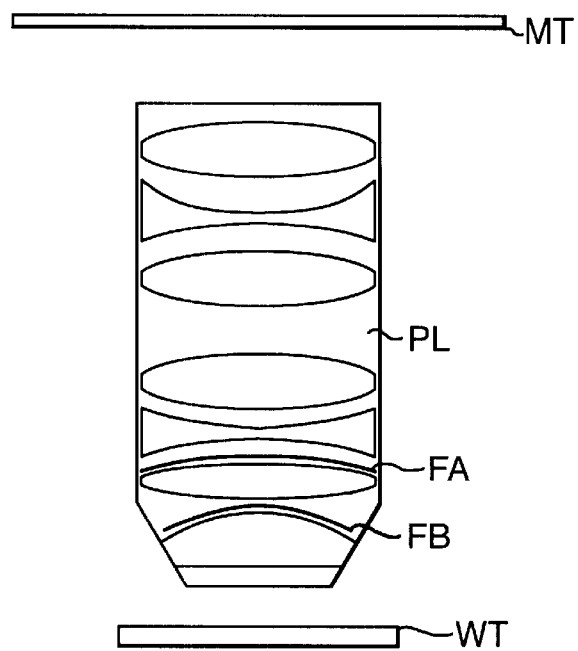
FIG. 7 schematically depicts the location of a filter consisting of two constituent filters on two separate carriers placed in series in the projection beam of the projection apparatus of FIG. 1.
Figure 8:
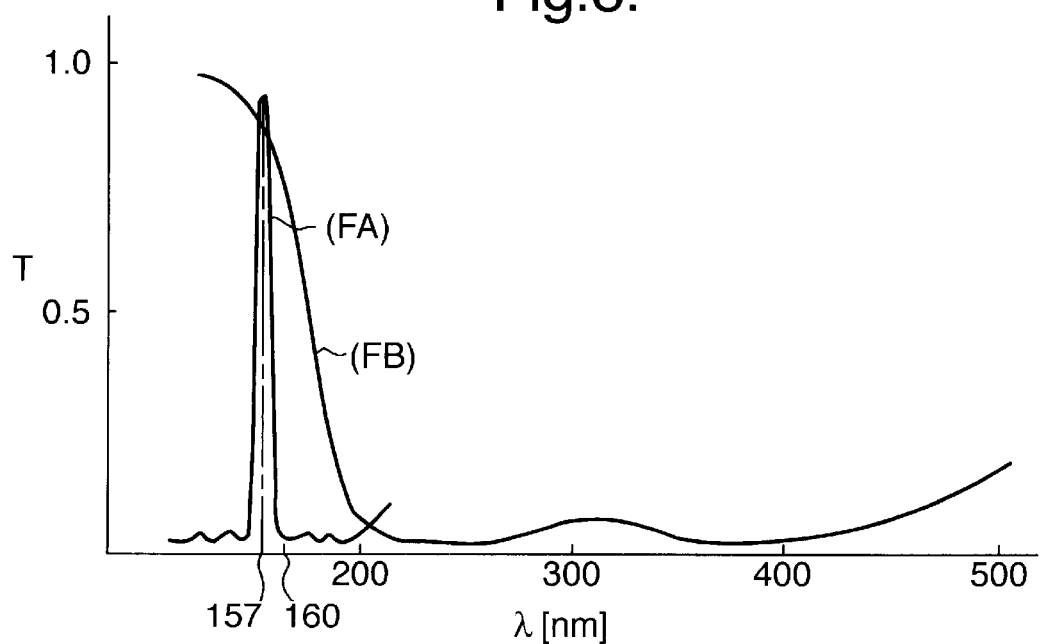
FIG. 8 schematically depicts the spectral transmission properties of two constituent filters on two separate carriers placed in series and suitable for use in the situation depicted in FIG. 7.

In another embodiment, the functionality of the filter (transmitting the wavelength of the projection beam radiation, and attenuating the wavelengths of generated fluorescence radiation) is split over at least two separate constituent filters placed in series in the projection beam. This is schematically shown in FIG. 7 were the function of attenuating fluorescent radiation is realized by two filters FA and FB. For instance, when the electromagnetic radiation of the projection beam has a wavelength of 157 nm, the spectrum of the —unwanted— generated fluorescence radiation may extend from a wavelength just slightly longer than 157 nm, for instance a wavelength of 160 nm, all the way up to wavelengths in the visible range of the electromagnetic radiation spectrum. One filter, e.g. FA in FIG. 7, may be designed to specifically attenuate a relatively small spectral band of fluorescence light with, for instance, wavelengths between 160 and 200 nm. The requirement of high transmission at 157 nm then implies, for this filter, a very steep transition in its spectral transmission curve. Typically such steep transitions can be realized with said band-pass filters, see the spectral transmittance of filter FA as indicated in FIG. 8 in which T, along the vertical axis, is the transmittance and λ, along the horizontal axis, is the wavelength of the fluorescence radiation. The other filter, FB in FIG. 7, may now be designed to specifically attenuate a broad spectral band of fluorescence light with, for instance, wavelengths between 200 and 500 nm, see the spectral transmittance of filter FB as indicated in FIG. 8. The requirement of high transmission at 157 nm does not imply a very steep transition in its spectral transmission curve between wavelengths of 157 and 160 nm, as was the case for filter FA. This relaxed requirement in combination with the attenuation requirement for a relatively broad range of wavelengths can typically be met and realized with said cut-off filters. The two filters together are now constituent in the sense that attenuation of fluorescence radiation is realized in the constituent wavelength ranges 160 nm–200 nm and 200 nm–500 nm.

Whilst specific embodiments of the invention have been described above, it will be appreciated that the invention may be practiced otherwise than as described. The description is not intended to limit the invention. In particular it will be appreciated that the invention may be used in a lithographic apparatus and in any other type of apparatus where attenuation of unwanted radiation is desirable.

What is claimed is:

1. A lithographic projection apparatus comprising:
    a radiation system constructed and arranged to supply a projection beam of electromagnetic radiation with a wavelength less than 160 nm;
    a first object table for holding a mask;
    a second object table for holding a substrate;
    a projection system constructed and arranged to provide a projection beam to image irradiated portions of the mask onto target portions of the substrate; and
    a filter, located in the projection beam path, the filter being constructed and arranged to attenuate fluorescence radiation with a wavelength longer than that of the projection beam.

2. An apparatus according to claim 1, wherein the filter comprises a plurality of layers, each layer having a refractive index, wherein the refractive index alternates between a relatively high value and relatively low value between successive layers.

3. An apparatus according to claim 1 wherein the filter comprises at least one pair of layers, the pair comprising a layer of relatively low refractive index material and a layer of relatively high refractive index material.

4. An apparatus according to claim 2 wherein the each layer of relatively high refractive index materials are made of one or more materials selected from the group consisting of: $Al_2O_3$, $LaF_3$, $NdF_3$, $GdF_3$, $DyF_3$, $LnF_3$, $ThF_4$, and $CeF_3$.

5. An apparatus according to claim 2, wherein each layer of relatively low refractive index are made of one or more materials selected from the group consisting of: $SiO_2$, $MgF_2$, $AlF_3$, $NaF$, $Na_3AlF_6$, $Na_5Al_3F_{14}$.

6. An apparatus according to claim 2, wherein the filter is a cut-off filter comprising 6–10 layers.

7. An apparatus according to claim 2, wherein the filter is a band-pass filter comprising 30–50 layers.

8. An apparatus according to claim 1, wherein the filter is adapted to transmit radiation with a wavelength in one of the range from 155 to 159 nm and the range from 124 to 128 nm.

9. An apparatus according to claim 1, wherein the filter is adapted to attenuate visible light.

10. An apparatus according to claim 1, wherein said filter comprises a coating on an optical component present in one of the projection system and the radiation system.

11. An apparatus according to claim 1, wherein said filter is located between said first and second object tables.

12. An apparatus according to claim 1, wherein said projection beam comprises radiation with a wavelength in one of the range from 155 to 159 nm and the range from 124 to 128 nm.

13. An apparatus according to claim 1, wherein said filter comprises a plurality of sub-filters in series arrangement, each sub-filter serving to attenuate a given portion of a wavelength spectrum of the said fluorescence radiation.

14. A method of manufacturing a device comprising:
    providing a mask bearing a pattern to a first object table;
    providing a substrate provided with a radiation-sensitive layer to a second object table;
    irradiating portions of the mask and imaging said irradiated portions of the mask onto target portions of said substrate; and
    employing a filter, located in the projection beam path, to attenuate fluorescence radiation with a wavelength longer than that of the projection beam wherein the projection beam comprises radiation having a wavelength less than 160 nm.

15. A device manufactured according to the method of claim 14.

16. An apparatus according to claim 1, wherein the filter shields the substrate from fluorescence radiation emitted by portions of the lithographic projection apparatus other than the substrate.

17. A method according to claim 14, wherein the filter shields the substrate from fluorescence radiation emitted by portions of the lithographic projection apparatus other than the substrate.

* * * * *

UNITED STATES PATENT AND TRADEMARK OFFICE
CERTIFICATE OF CORRECTION

PATENT NO. : 6,473,163 B2
DATED : October 29, 2002
INVENTOR(S) : Mulkens et al.

It is certified that error appears in the above-identified patent and that said Letters Patent is hereby corrected as shown below:

<u>Title page,</u>
Item [56], References Cited,
please amend:
"5,072,108 A * 12/1991 Auilera et al. ………………..250/226"
to read as
-- 5,072,109 A * 12/1991 Aguilera, Jr. et al. ………….250/226 --

Signed and Sealed this

First Day of April, 2003

JAMES E. ROGAN
*Director of the United States Patent and Trademark Office*